US010446426B2

(12) United States Patent
Fuji et al.

(10) Patent No.: US 10,446,426 B2
(45) Date of Patent: Oct. 15, 2019

(54) ATMOSPHERE FORMATION APPARATUS AND FLOATATION CONVEYANCE METHOD

(71) Applicant: THE JAPAN STEEL WORKS, LTD., Shinagawa-ku, Tokyo (JP)

(72) Inventors: Takahiro Fuji, Kanagawa (JP); Ryo Shimizu, Kanagawa (JP)

(73) Assignee: THE JAPAN STEEL WORKS, LTD., Tokyo (JP)

(*) Notice: Subject to any disclaimer, the term of this patent is extended or adjusted under 35 U.S.C. 154(b) by 0 days.

(21) Appl. No.: 15/553,989

(22) PCT Filed: Jan. 27, 2016

(86) PCT No.: PCT/JP2016/052376
§ 371 (c)(1),
(2) Date: Aug. 26, 2017

(87) PCT Pub. No.: WO2016/136366
PCT Pub. Date: Sep. 1, 2016

(65) Prior Publication Data
US 2018/0033664 A1 Feb. 1, 2018

(30) Foreign Application Priority Data
Feb. 27, 2015 (JP) .................. 2015-039313

(51) Int. Cl.
*H01L 21/677* (2006.01)
*B65G 49/06* (2006.01)
(Continued)

(52) U.S. Cl.
CPC ...... *H01L 21/67736* (2013.01); *B23K 26/123* (2013.01); *B65G 49/06* (2013.01);
(Continued)

(58) Field of Classification Search
CPC ....... B65G 49/06; B65G 49/065; B65G 51/03
(Continued)

(56) References Cited

U.S. PATENT DOCUMENTS 6,071,796 A 6/2000 Voutsas
7,604,439 B2 * 10/2009 Yassour .................. B24B 37/30
406/86

(Continued)

FOREIGN PATENT DOCUMENTS

CN 101409221 A 4/2009
CN 105830201 A 8/2016
(Continued)

OTHER PUBLICATIONS

International Search Report (ISR) and Written Opinion dated May 10, 2016 issued in International Application No. PCT/JP2016/052376.
(Continued)

*Primary Examiner* — William R Harp
(74) *Attorney, Agent, or Firm* — Holtz, Holtz & Volek PC

(57) ABSTRACT

The invention is an atmosphere formation apparatus that is provided in a floatation conveyance apparatus, the floatation conveyance apparatus conveying a workpiece while performing floating support of the workpiece by gas injection, the atmosphere formation apparatus including a small-range atmosphere formation device that forms a small-range atmosphere B in a large-range atmosphere A, the large-range atmosphere A being an atmosphere in a large-range region containing a conveyance path along which the conveyance is performed, the small-range atmosphere B being an atmosphere in a small-range region containing the conveyance path, the small-range atmosphere B being different from the large-range atmosphere A.

15 Claims, 5 Drawing Sheets

(51) Int. Cl.
*H01L 21/20* (2006.01)
*H01L 21/268* (2006.01)
*H01L 21/02* (2006.01)
*B23K 26/12* (2014.01)
*H01L 21/67* (2006.01)
*B23K 103/00* (2006.01)

(52) U.S. Cl.
CPC ............ *B65G 49/065* (2013.01); *H01L 21/02* (2013.01); *H01L 21/02532* (2013.01); *H01L 21/20* (2013.01); *H01L 21/2007* (2013.01); *H01L 21/268* (2013.01); *H01L 21/67784* (2013.01); *B23K 2103/54* (2018.08); *H01L 21/0242* (2013.01); *H01L 21/67051* (2013.01)

(58) Field of Classification Search
USPC .............................................. 406/86, 88, 89
See application file for complete search history.

(56) References Cited

U.S. PATENT DOCUMENTS

| | | | | |
|---|---|---|---|---|
| 7,714,251 | B2 * | 5/2010 | Miyairi | B23K 26/032 219/121.65 |
| 8,106,330 | B2 * | 1/2012 | Arao | B23K 26/0732 219/121.82 |
| 8,324,086 | B2 * | 12/2012 | Shimomura | B23K 26/08 257/E21.134 |
| 8,772,128 | B2 * | 7/2014 | Yamazaki | B23K 26/03 438/458 |
| 9,248,643 | B2 * | 2/2016 | Somekh | B05B 17/0638 |
| 9,273,392 | B2 * | 3/2016 | Vermeer | C23C 16/45551 |
| 9,347,563 | B2 * | 5/2016 | Pocza | C23C 14/56 |
| 2004/0106242 | A1 | 6/2004 | Arao et al. | |
| 2007/0241086 | A1 | 10/2007 | Arao et al. | |
| 2009/0111244 | A1 | 4/2009 | Yamazaki et al. | |
| 2018/0315633 | A1 * | 11/2018 | Shimizu | H01L 21/268 |

FOREIGN PATENT DOCUMENTS

| | | |
|---|---|---|
| JP | 2000072251 A | 3/2000 |
| JP | 2000138180 A | 5/2000 |
| JP | 2000349041 A | 12/2000 |
| JP | 2002231654 A | 8/2002 |
| JP | 3502981 B2 | 3/2004 |
| JP | 2004179653 A | 6/2004 |
| JP | 2006264939 A | 10/2006 |
| JP | 2007051001 A | 3/2007 |
| JP | 2008153261 A | 7/2008 |
| JP | 2009135430 A | 6/2009 |
| JP | 2012054603 A | 3/2012 |
| KR | 20090037332 A | 4/2009 |
| TW | 200931536 A | 7/2009 |
| TW | 201546904 A | 12/2015 |
| WO | 2015174347 A1 | 11/2015 |

OTHER PUBLICATIONS

English translation of the International Preliminary Report on Patentability (IPRP) dated Sep. 8, 2017 issued in counterpart International Application No. PCT/JP2016/052376.

* cited by examiner

FIG.5
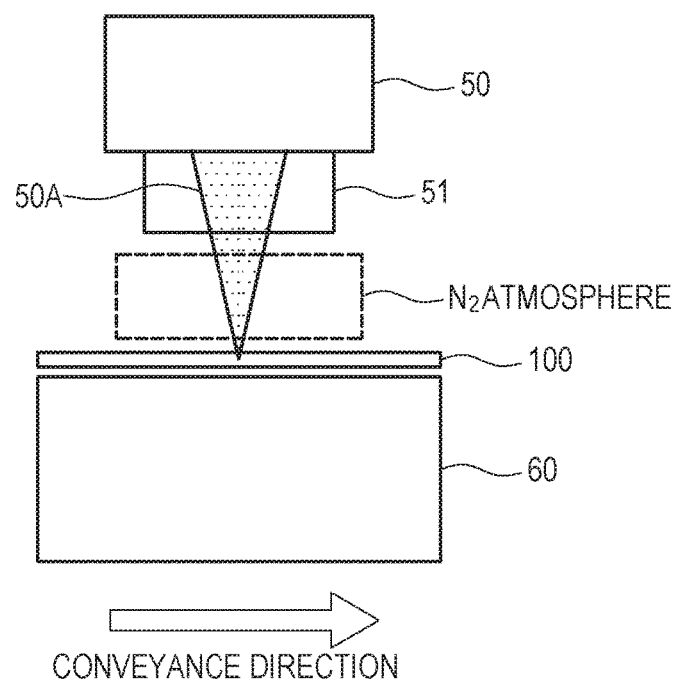
A
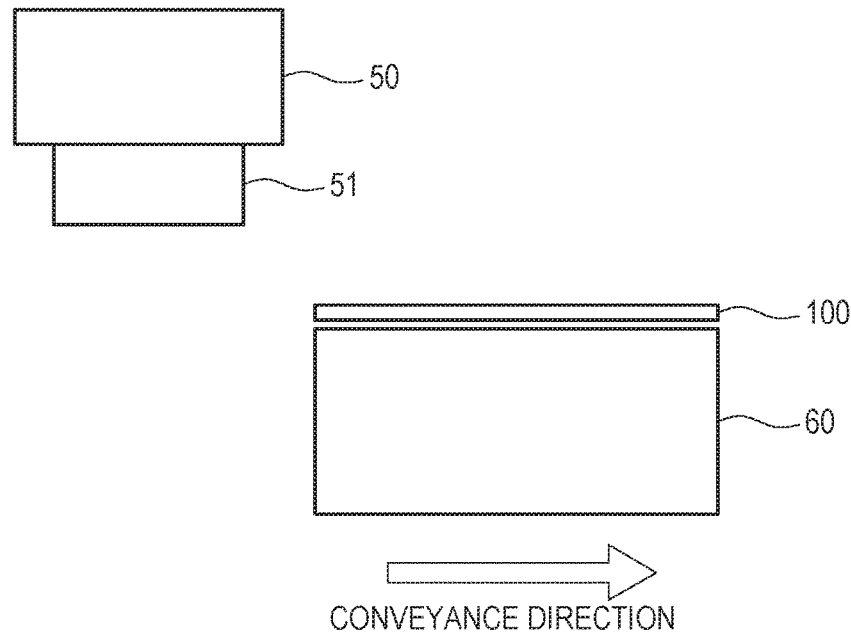
B

ATMOSPHERE FORMATION APPARATUS AND FLOATATION CONVEYANCE METHOD

TECHNICAL FIELD

The invention relates to an atmosphere formation apparatus that forms an atmosphere at the time of conveyance floating workpiece, and a floating conveyance method.

BACKGROUND ART

As a laser processing apparatus that conveys and works a glass substrate for producing a liquid crystal display, there is known a crystallization apparatus that crystallizes an amorphous silicon film by a laser.

Conventionally, in the crystallization apparatus, there is proposed a technology of emitting the laser to the amorphous silicon film while filling the vicinity of a laser emitter with an inert gas.

For example, Patent Literature 1 proposes a method of providing a gas injector and an edge-portion straightening surface that extends in a scanning direction, and appropriately securing an atmosphere from the vicinity of the laser emitter to the periphery in the scanning direction by making the gas injected from the gas injector flow between the edge-portion straightening surface and the glass substrate.

In Patent Literature 2, nitrogen gas is injected to an emission portion by a swing nozzle, so that a nitrogen gas atmosphere is secured.

In Patent Literature 3, the interior of a vacuum chamber is in a vacuum or nitrogen (atmospheric pressure) atmosphere state, and thereby, the action of substances in the air on a thin non-crystalline semiconductor film during annealing is prevented.

CITATION LIST

Patent Literature

[Patent Literature 1]
 Japanese Patent Laid-Open No. 2012-54603
[Patent Literature 2]
 Japanese Patent Laid-Open No. 2000-349041
[Patent Literature 3]
 Japanese Patent No. 3502981

SUMMARY OF INVENTION

Technical Problem

In the conventional invention, the glass substrate is loaded on a conveyance stage having a size equivalent to the glass substrate or a size greater than the glass substrate, and is moved together with the stage. Further, the laser emission portion is fixed to the emission apparatus.

FIGS. 5A, 5B show a schematic configuration of an example of the conventional apparatus. In a laser emitter 50, an inert gas injector 51 is provided. For example, nitrogen or an inert gas is injected downward from the inert gas injector 51, and a laser 50A is emitted to a glass substrate 100 to be conveyed with a stage 60, through the inert gas injector 51.

As shown in FIG. 5A, when the glass substrate 100 comes to below the laser emitter 50 by the movement of the stage 60, an inert gas such as nitrogen, for example, is injected from the inert gas injector 51, simultaneously with the emission of the laser 50A, and thereby, the air on the glass substrate 100 is removed at the time of the laser emission.

In the first place, the reason why the air is removed at the time of the laser emission is to prevent substances such as oxygen contained in the air from acting on the non-crystalline semiconductor film formed on the glass substrate during the laser emission. Further, it is said that the emitted laser is influenced by the fluid in the periphery, and therefore, it is desired that the injected inert gas flows as straight as possible, with no disturbance, at the laser emitter.

As described above, conventionally, the stage arrives at the laser emitter, and the inert gas atmosphere is produced around the laser emitter by the gap between the glass substrate loaded on the stage and the inert gas injector at an upper portion.

However, in the conventional method, the inert gas atmosphere is formed only when the moving glass substrate arrives at the laser emitter, and therefore, at the vicinity of a position where the inert gas is injected, the laser emission is performed while the flow of the gas is disturbed. In the case where the glass substrate 100 is not below the laser emitter 50 as shown in FIG. 5B, the inert gas atmosphere is not formed because there is no gap around the inert gas injector 51.

Further, the flow volume of the inert gas that flows from the inert gas injector for realizing the straight flow is very small, and therefore, the air moving together with the stage cannot be perfectly removed at the laser emitter.

Thus, the laser emitter is fixed in the emission apparatus, and the laser is emitted to the glass substrate in a state where the conveyance stage having the glass substrate loaded is moving. Therefore, there is a problem in producing a local inert gas atmosphere with little disturbance.

The invention has been made in the context of the above circumstance, and has an object to provide an atmosphere formation apparatus and a floating conveyance method that make it possible to form a stable atmosphere on the conveyance path regardless of the conveyance position of the workpiece.

Solution to Problem

That is, the invention according to a first aspect of the atmosphere formation apparatus in the invention is an atmosphere formation apparatus that is provided in a floatation conveyance apparatus, the floatation conveyance apparatus conveying a workpiece while performing floating support of the workpiece by gas injection, the atmosphere formation apparatus including a small-range atmosphere formation device that forms a small-range atmosphere in a large-range atmosphere, the large-range atmosphere being an atmosphere in a large-range region containing a conveyance path along which the conveyance is performed, the small-range atmosphere being an atmosphere in a small-range region containing the conveyance path, the small-range atmosphere being different from the large-range atmosphere.

According to the invention, by the small-range atmosphere formation device, the small-range atmosphere different from the large-range atmosphere is formed in the large-range atmosphere, and a stable small-range atmosphere is obtained on the conveyance path regardless of the existence of a workpiece.

As an invention of an atmosphere formation apparatus according to another aspect, in one aspect of the invention, the large-range atmosphere and the small-range atmosphere contain a floating injection gas injected for the floating support, as part of atmosphere gases, and the floating injection gas in the large-range atmosphere and the floating injection gas in the small-range atmosphere are different from each other.

According to the invention, it is possible to use the floating injection gas as part of the atmosphere gases, and to simplify the apparatus configuration.

As an invention of an atmosphere formation apparatus according to another aspect, in any one aspect of the inventions, an atmosphere gas in the large-range atmosphere and an atmosphere gas in the small-range atmosphere are different from each other in gas component.

According to the above invention, it is possible to adopt atmospheres different in gas component, in the large-range atmosphere and the small-range atmosphere, and to move the workpiece in the different gas atmospheres along the conveyance path.

As an invention of an atmosphere formation apparatus according to another aspect, in any one aspect of the inventions, a gas in the large-range atmosphere and a gas in the small-range atmosphere are composed of an identical component and are different from each other in purity.

According to the above invention, it is possible to form the atmospheres using gases composed of an identical component and different in purity, as the large-range atmosphere and the small-range atmosphere.

An invention of an atmosphere formation apparatus according to another aspect, in any one aspect of the inventions, includes a large-range atmosphere formation device that forms the large-range atmosphere, the large-range atmosphere formation device including a large-range gas introducer that introduces an atmosphere gas from an exterior of the large-range region.

According to the invention, the gas can be introduced from the exterior of the large-range region by the large-range gas introducer, and can be used as at least part of the atmosphere gas in the large-range atmosphere.

As an invention of an atmosphere formation apparatus according to another aspect, in any one aspect of the inventions, the small-range atmosphere formation device includes a small-range gas introducer that introduces an atmosphere gas from an exterior of the large-range region and the small-range region.

According to the invention, the gas can be introduced from the exterior of the large-range region and the small-range region by the small-range gas introducer, and can be used as at least part of the gas in the small-range atmosphere.

As an invention of an atmosphere formation apparatus according to another aspect, in any one aspect of the inventions, the small-range atmosphere formation device includes a downward gas injector that injects an atmosphere gas from an upper side in accordance with at least the whole or part of a floating injection gas that is injected from a lower side.

According to the invention, the small-range atmosphere is formed at least by the floating injection gas and the gas injected from the downward gas injector. Further, by moving the workpiece at a position where the floating injection gas and the gas injected from the downward gas injector are balanced, it is possible to reduce the disturbance of the gas due to the conveyance of the workpiece as much as possible.

As an invention of an atmosphere formation apparatus according to another aspect, in any one aspect of the inventions, a downward gas injector is positioned such that the conveyance path for the workpiece is positioned between a gas injected from the downward gas injector and a floating injection gas.

According to the invention, the workpiece is conveyed on the conveyance path between the gas injected from the downward gas injector and the gas injected from a gas floating gas injector, and the workpiece can be moved in the large-range atmosphere and the small-range atmosphere.

As an invention of an atmosphere formation apparatus according to another aspect, in any one aspect of the inventions, the small-range atmosphere is formed in a region containing a working area for the workpiece.

According to the invention, the working area for the workpiece can be disposed in the small-range atmosphere, and the working can be performed in a desired atmosphere.

As an invention of an atmosphere formation apparatus according to another aspect, in any one aspect of the inventions, the small-range atmosphere contains a region on a conveyance-directional upstream side of a working area for the workpiece.

According to the invention, it is possible to cover the workpiece with the small-range atmosphere before the workpiece arrives at the working area, and to obtain a stable atmosphere before the working.

As an invention of an atmosphere formation apparatus according to another aspect, in any one aspect of the inventions, the small-range atmosphere contains a region on a conveyance-directional downstream side of a working area for the workpiece.

According to the invention, the small-range atmosphere exists on the upstream side of the working area, and therefore, it is possible to cover the workpiece after the working with the small-range atmosphere.

As an invention of an atmosphere formation apparatus according to another aspect, in any one aspect of the inventions, the small-range atmosphere formation device is formed so as to cover both vertical sides and both conveyance-directional lateral sides of the workpiece that is conveyed in the small-range atmosphere.

According to the invention, the small-range atmosphere is formed so as to surround the workpiece from both vertical sides and both lateral sides, at the conveyance position of the workpiece, and it is possible to secure a stable small-range atmosphere regardless of the conveyance position of the workpiece.

As an invention of an atmosphere formation apparatus according to another aspect, in any one aspect of the inventions, the large-range region and the small-range region are included in a processing chamber in which the workpiece is processed.

According to the invention, the large-range atmosphere and the small-range atmosphere are formed in the processing chamber in which the workpiece is processed.

A first aspect of a floating conveyance method in the invention is a floating conveyance method for conveying a workpiece while performing floating support of the workpiece by gas injection, the floating conveyance method including: a step of forming a small-range atmosphere in a large-range atmosphere, the large-range atmosphere being an atmosphere in a large-range region containing a conveyance path along which the conveyance is performed, the small-range atmosphere being an atmosphere in a small-range region containing the conveyance path along which the conveyance is performed, the small-range atmosphere being different from the large-range atmosphere; and a step of conveying the workpiece along the conveyance path through the large-range atmosphere and the small-range atmosphere.

An invention of a floating conveyance method according to another aspect, in one aspect of the invention, includes a step of forming the large-range atmosphere in the large-range region.

Advantageous Effect of Invention

That is, the invention has an effect of making it possible to form the small-range atmosphere in a predetermined region and form an atmosphere with no disturbance, regardless of the existence of a workpiece.

BRIEF DESCRIPTION OF DRAWINGS

The above and other objects, advantages and features of the present invention will become more fully understood from the detailed description given hereinbelow and the appended drawings which are given by way of illustration only, and thus are not intended as a definition of the limits of the present invention, and wherein:

FIG. 5 is a diagram showing a schematic configuration of a conventional laser processing apparatus, in which Figure A shows a state where a glass substrate comes to below a laser emitter 50, an inert gas is injected from an inert gas injector 51 and the air on the glass substrate 100 is removed at the time of laser emission, and Figure B shows a state where the glass substrate deviates from below the laser emitter 50.

DESCRIPTION OF EMBODIMENTS

Hereinafter, an embodiment of the invention will be described based on the accompanying drawings.

Figure 1:
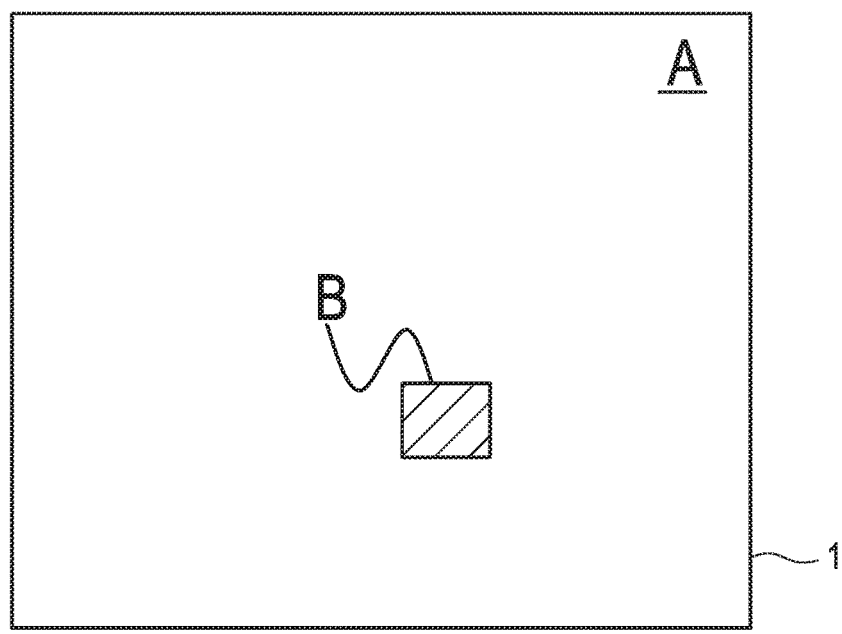
FIG. 1 is a diagram for describing a large-range atmosphere and a small-range atmosphere in the invention.

FIG. 1 is a diagram showing a plane of a laser processing apparatus, and a large-range atmosphere A that is a large-range atmosphere and a small-range atmosphere B that is a local atmosphere are formed in a processing chamber 1.

Embodiment 1

In Embodiment 1, the description will be made assuming that the large-range atmosphere and the small-range atmosphere are formed in the processing chamber, but in the invention is not limited to the atmospheres in the processing chamber. In FIG. 1, the processing chamber 1 is shown as an enclosed space. However, in the case where the large-range atmosphere and the small-range atmosphere are formed in the processing chamber 1, the processing chamber is not limited to an enclosed space, and can have a configuration in which a workpiece is continuously conveyed into the processing chamber. In this case, it is allowable to provide an openable and closable door, curtain or the like in the processing chamber. An atmosphere gas composing the large-range atmosphere is continuously introduced into a large-range region at an appropriate timing, and thereby, the atmosphere can be maintained.

The above atmosphere is formed by an atmosphere formation apparatus described below.

Figure 2:
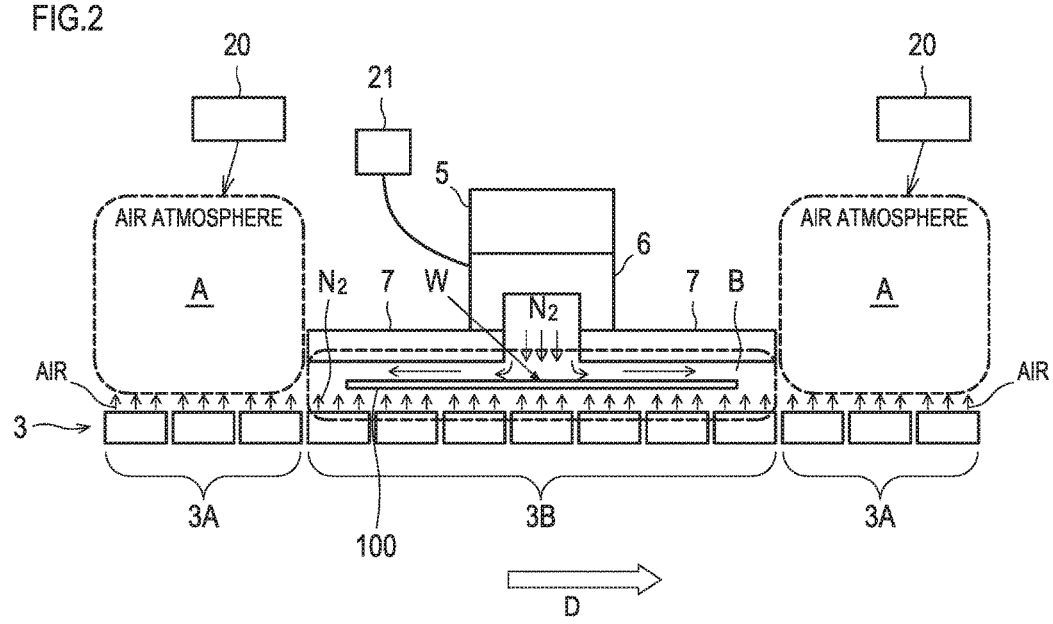
FIG. 2 is a diagram showing a laser processing apparatus that includes an atmosphere formation apparatus according to an embodiment of the invention, similarly.

As shown in FIG. 2, in a laser processing apparatus 2 in Embodiment 1, many stages 3 configured to float a workpiece for injecting the compressed fluid supplied from the exterior are arranged for conveying a glass substrate 100. The glass substrate 100 corresponds to the workpiece in the invention. The workpiece in the invention is not limited to the glass substrate.

Here, the stage 3 is formed by a porous shape, a hole, a groove or the like, and injects the fluid from an upper surface of the device when the compressed fluid is put in. By the fluid supplied from the stage 3, a lower surface of the glass substrate 100 receives a fluid force, and is supported at a certain height so as to be away from the stage 3, in a floating and contactless manner. The conveyance path in the invention is a path along the support position. The glass substrate 100 is conveyed so as to be moved along the stages 3 in a state where a part of the glass substrate 100 is held by an unillustrated conveyance mechanism, which is a separate mechanism from the invention. The configuration of the conveyance mechanism is not limited to this, and in short, only needs to be a configuration allowing the conveyance of the floated glass substrate.

In Embodiment 1, there is a working area W, and a laser emitter 5 is provided above the working area W. The laser emitter 5 has a size corresponding to the conveyance-directional lateral shape of the glass substrate 100 to which the working process is performed, and a laser output from an unillustrated laser light source and made in a predetermined shape is emitted toward the glass substrate 100. Further, at the vicinity of the laser emitter 5, a nitrogen injector 6, which is separate from the stage, is provided on a lower surface of the laser emitter 5. The nitrogen injector 6 can inject nitrogen downward, and can transmit the laser downward. The nitrogen injector 6 corresponds to the downward gas injector in the invention.

In Embodiment 1, the laser light is made in a line beam shape, and is emitted to the glass substrate 100 such that the line direction of the line beam crosses the conveyance direction. The nitrogen injector 6 injects nitrogen linearly along the shape of the line beam.

An upper-surface wall portion 7 is provided at the lower surfaces and periphery of the laser emitter 5 and the nitrogen injector 6. In the gap, the glass substrate 100 moves along a movement direction D, and thereby, the flow of the gas depending on the existence of the glass substrate 100 becomes small. The upper-surface wall portion 7 extends also in a direction orthogonal to the conveyance direction, so as to correspond to the line beam shape.

The stages 3 at a position corresponding to the upper-surface wall portion 7 are configured by stages 3B configured to float a workpiece that inject nitrogen gas upward, and the outer stages 3 are configured by stages 3A configured to float a workpiece that inject air upward. That is, the stage 3A and the stage 3B are collectively referred to as the stage 3.

The nitrogen injector 6 in the laser emitter 5 injects the nitrogen supplied from a nitrogen introducer 21 in the exterior, and as a flow with no disturbance due to the internal structure of the nitrogen injector 6, the nitrogen is injected from the nitrogen injector 6 to an upper surface of the glass substrate 100. The injected nitrogen flows to the outside of the glass substrate 100, along the gap between the upper surface of the glass substrate 100 and the upper-surface wall portion 7. The nitrogen introducer corresponds to the small-range gas introducer in one aspect of the invention.

The lower surface of the glass substrate 100 is supported by the nitrogen injected from the stage 3B, in a floating and contactless manner, and the lower surface of the glass substrate 100 is filled with the nitrogen, similarly to the upper surface. The injection nitrogen injected from the stage 3B corresponds to the floating injection gas in the invention.

As described above, by the nitrogen injector 6 and the upper-surface wall portion 7, the nitrogen injected from the nitrogen injector 6 is positioned so as to accord with at least the whole or part of the injection nitrogen from the stage 3B, and the vicinity of the laser emitter 5 is filled with the nitrogen. Therefore, it is possible to form and maintain a local nitrogen atmosphere, that is, the small-range atmosphere B. The small-range atmosphere B is formed so as to cover the upper side, the lower side and both lateral sides of the glass substrate 100, and the working area W is positioned in the small-range atmosphere B.

That is, the stage 3B, the nitrogen injector 6 and the upper-surface wall portion 7 constitute the small-range atmosphere formation device in the invention.

In the embodiment, even when the glass substrate 100 is not below the laser emitter 5, the nitrogen atmosphere is formed by the nitrogen injection from the upper and lower surfaces. When the glass substrate 100 is not below the laser emitter 5, because the expansion of the nitrogen due to the glass substrate 100 does not occur, the small-range atmosphere is in a narrower range than when the glass substrate is below the laser emitter 5. However, a size allowing the working area W and the periphery to be covered is secured.

The small-range atmosphere does not need to be constantly formed during the conveyance of the glass substrate, and only needs to be formed at least by the time when the glass substrate 100 is conveyed in the movement direction D and arrives at the region where the small-range atmosphere B is formed, or the time when the glass substrate 100 arrives at the working area W.

Further, in the large-range region, the large-range atmosphere A composed of air is formed, and in the large-range atmosphere A, it is allowable to use the cleaned air introduced from an air introducer 20 in the exterior of the large-range region, or use the air in the atmospheric air with no change. The air introducer 20 corresponds to the large-range gas introducer in one aspect of the invention.

Furthermore, in the large-range region where the large-range atmosphere A is formed, the atmosphere is formed by adding the injection air injected upward from the stage 3A. The injection air corresponds to the floating injection gas in one aspect of the invention.

In the embodiment, the glass substrate 100 is floated by the compressed air, and the nitrogen as the inert gas is injected at the vicinity of the laser emitter 5. However, the combination of the fluids is not limited to this, and all fluids that can be used for the laser emission are applicable. Further, for example, it is allowable to use gasses composed of an identical component in the large-range atmosphere and the small-range atmosphere and use gasses different from each other in purity in the large-range atmosphere and the small-range atmosphere. In this case, it is preferable that an inert gas having a higher purity be used in the small-range atmosphere.

Further, in the embodiment, the same mechanism is configured also in the forward and backward directions in FIG. 2. Thereby, when the glass substrate 100 arrives at the small-range atmosphere B, the glass substrate 100 is covered with the atmosphere gas from the upper side, the lower side and both lateral sides of the glass substrate 100. Further, it is preferable that at least the gas injection range of the nitrogen injector 6 and the upper-surface wall portion 7 be positioned to the outside of the working area W in the direction perpendicular to the conveyance direction, and it is preferable that the gas injection range of the stage 3B be positioned to the outside of the working area W similarly.

Embodiment 2

Figure 3:
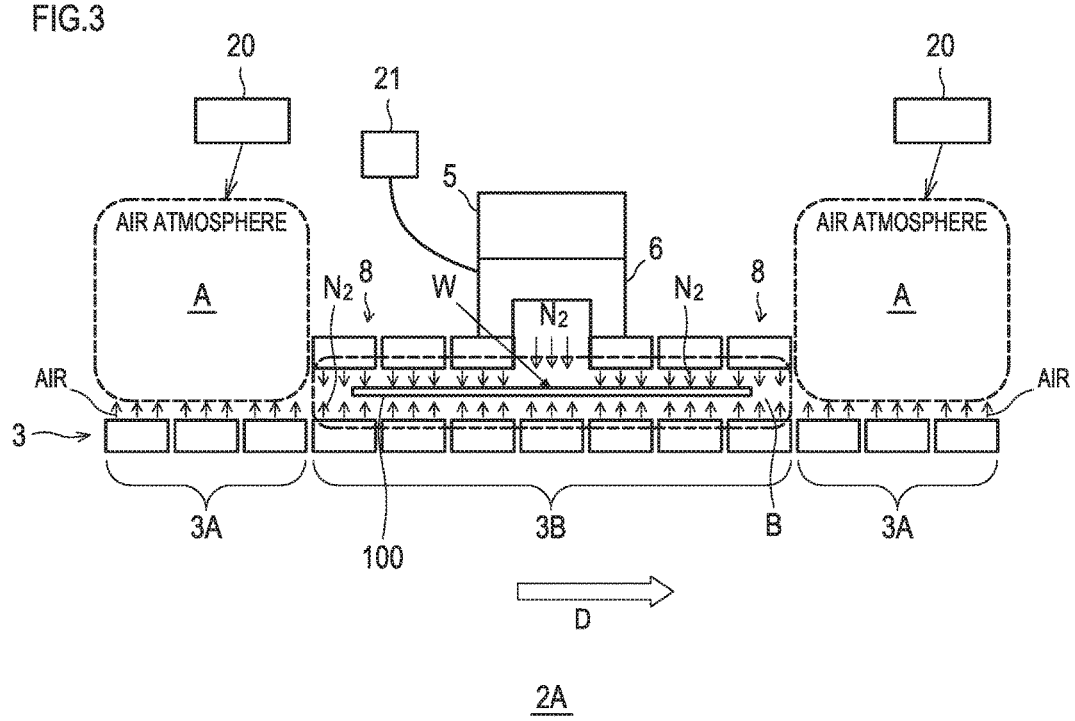
FIG. 3 is a diagram showing a laser processing apparatus that includes an atmosphere formation apparatus according to an alternative embodiment of the invention, similarly.

Next, FIG. 3 shows a schematic diagram of Embodiment 2. Here, the same reference characters are assigned to the same constituents as Embodiment 1, and the descriptions are omitted or simplified.

In a laser processing apparatus 2A shown in the embodiment, many stages 3 configured to float a workpiece for injecting the compressed fluid supplied from the exterior are arranged below the conveyance path, for conveying the glass substrate 100. Here, the stage 3 is formed by a porous shape, a hole, a groove or the like, and injects the fluid from the upper surface of the device when the compressed fluid is put in. By the fluid supplied from the stage 3, the lower surface of the glass substrate 100 receives a fluid force, and is supported at a certain height so as to be away from the stage 100, in a floating and contactless manner. The conveyance path in the invention is a path along the support position. The glass substrate 100 is conveyed so as to be moved along the stages 3 in a state where a part of the glass substrate 100 is held by an unillustrated conveyance mechanism, which is a separate mechanism from the invention.

The laser processing apparatus 2A includes the working area W, and the laser emitter 5 is provided above the working area W. The laser emitter 5 has a size corresponding to the conveyance-directional lateral shape of the glass substrate 100 to which the working process is performed, and a laser output from an unillustrated laser light source and made in a predetermined shape is emitted toward the glass substrate 100. Further, at the vicinity of the laser emitter 5, the nitrogen injector 6, which is separate from the stage, is provided on the lower surface of the laser emitter 5. The nitrogen injector 6 injects nitrogen downward, and transmits the laser light downward.

Furthermore, on both lateral sides of the nitrogen injector 6, there are downward nitrogen injectors 8 that have a performance equivalent to the performance of the stages 3 at the lower portion and that inject nitrogen to the lower surface side. In accordance with the line beam shape, downward nitrogen injectors 8 are similarly arranged also along the direction crossing the conveyance direction. The downward nitrogen injector 8 corresponds to the downward gas injector in one aspect of the invention.

The stages 3 at positions corresponding to the downward nitrogen injectors 8 are configured by the stages 3B that inject nitrogen gas upward, and the outer stages 3 are configured by the stages 3A that inject air upward. That is, the stage 3A and the stage 3B are collectively referred to as the stage 3.

The nitrogen injector 6 in the laser emitter 5 injects the nitrogen supplied from the nitrogen introducer 21 in the exterior, and as a flow with no disturbance due to the internal structure of the nitrogen injector 6, the nitrogen is injected from the nitrogen injector 6 to the upper surface of the glass substrate 100. The downward nitrogen injector 8 injects the nitrogen supplied from the nitrogen introducer 21 in the exterior, in the vertically downward direction, so that the nitrogen is injected to the upper surface of the glass substrate 100. The nitrogen injected from the nitrogen injector 6 and the downward nitrogen injector 8 flows to the outside of the glass substrate, along the gap between the upper surface of the glass substrate 100 and the downward nitrogen injector 6.

The lower surface of the glass substrate 100 is supported by the nitrogen injected from the stage 3B, in a floating and contactless manner. The lower surface of the glass substrate 100 is filled with the nitrogen, similarly to the upper surface.

As described above, the nitrogen injected from the nitrogen injector 6 and the downward nitrogen injector 8 is positioned so as to accord with at least the whole or part of the injection nitrogen from the stage 3B, and the vicinity of the laser emitter 5 is filled with the nitrogen. Therefore, it is possible to form and maintain a local nitrogen atmosphere, that is, the small-range atmosphere B.

That is, the stage 3B, the nitrogen injector 6 and the downward nitrogen injector 8 constitute the small-range atmosphere formation device in the invention.

Further, even when the glass substrate 100 is not below the laser emitter 5, the nitrogen atmosphere is formed by the nitrogen injection from the upper and lower surfaces. In the embodiment, the nitrogen is injected just downward by the downward nitrogen injector 8, and the small-range atmosphere is secured regardless of the existence of the glass substrate 100. The small-range atmosphere B is formed so as to cover the upper side, the lower side and both lateral sides of the glass substrate 100, and the working area W is positioned in the small-range atmosphere B.

The small-range atmosphere does not need to be constantly formed during the conveyance of the glass substrate, and only needs to be formed at least by the time when the glass substrate 100, in the movement direction D, arrives at the region where the small-range atmosphere B is formed, or the time when the glass substrate 100 arrives at the working region.

Further, in the large-range region, the large-range atmosphere A composed of air is formed, and in the large-range atmosphere A, it is allowable to use the cleaned air introduced from the air introducer 20, or use the air in the atmospheric air with no change.

Furthermore, in the large-range region where the large-range atmosphere A is formed, the atmosphere is formed by adding the injection air injected upward from the stage 3A.

In the embodiment, the glass substrate 100 is floated by the compressed air, and the nitrogen as the inert gas is injected at the vicinity of the laser emitter 5. However, the combination of the fluids is not limited to this, and all fluids that can be used for the laser emission are applicable. Further, for example, it is allowable to use an identical kind of gas and use gasses different in purity in the large-range atmosphere and the small-range atmosphere. In this case, it is preferable that an inert gas having a higher purity be used in the small-range atmosphere.

Further, in the embodiment, the same mechanism is configured also in the forward and backward directions in FIG. 3. Thereby, when the glass substrate 100 arrives at the small-range atmosphere B, the glass substrate 100 is covered with the atmosphere gas from the upper side, the lower side and both lateral sides of the glass substrate 100. Further, it is preferable that at least the gas injection range of the nitrogen injector 6 and the upper-surface wall portion 7 be positioned to the outside of the working area W in the direction perpendicular to the conveyance direction, and it is preferable that the gas injection range of the stage 3B be positioned to the outside of the working area W similarly.

Embodiment 3

Figure 4:
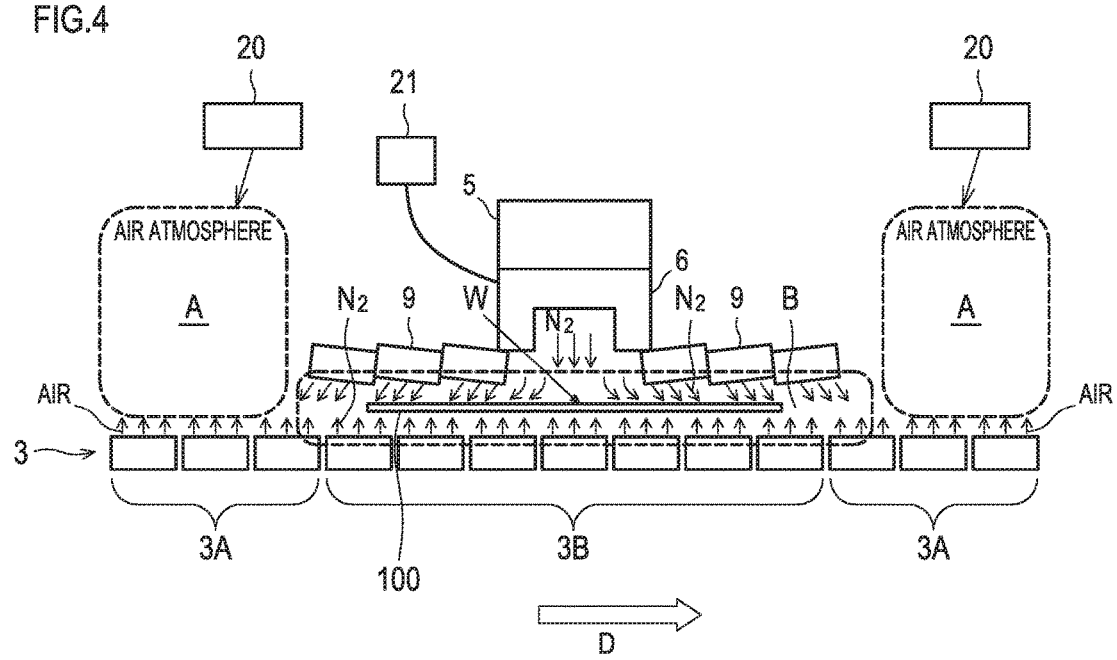
FIG. 4 is a diagram showing a laser processing apparatus that includes an atmosphere formation apparatus according to a further alternative embodiment of the invention, similarly.

Next, FIG. 4 shows a schematic diagram of Embodiment 3. Here, the same reference characters are assigned to the same constituents as Embodiment 1, and the descriptions are omitted or simplified.

In a laser processing apparatus 2B shown in the embodiment, many stages 3 configured to float a workpiece for injecting the compressed fluid supplied from the exterior are arranged below the conveyance path, for conveying the glass substrate 100. Here, the stage 3 is formed by a porous shape, a hole, a groove or the like, and injects the fluid from the upper surface of the device when the compressed fluid is put in. By the fluid supplied from the stage 3, the lower surface of the glass substrate 100 receives a fluid force, and is supported at a certain height so as to be away from the stage 100, in a floating and contactless manner. The conveyance path in the invention is a path along the support position. The glass substrate 100 is conveyed so as to be moved along the stages 3 in a state where a part of the glass substrate 100 is held by an unillustrated conveyance mechanism, which is a separate mechanism from the invention.

The laser processing apparatus 2B includes the working area W, and the laser emitter 5 is provided above the working area W. The laser emitter 5 has a size corresponding to the conveyance-directional lateral shape of the glass substrate 100 to which the working process is performed, and a laser output from an unillustrated laser light source and made in a predetermined shape is emitted toward the glass substrate 100. Further, at the vicinity of the laser emitter 5, the nitrogen injector 6, which is separate from the stage, is provided on the lower surface of the laser emitter 5. The nitrogen injector 6 injects nitrogen downward, and transmits the laser light downward.

Furthermore, on both lateral sides of the nitrogen injector 6, there are downward nitrogen injectors 9 that have a performance equivalent to the performance of the stages 3 at the lower portion and that are obliquely provided so as to inject nitrogen to sides (in oblique directions) that are lower surface sides and conveyance-directional outer sides with respect to the working area W. The downward nitrogen injector 9 corresponds to the downward gas injector in one aspect of the invention.

The stages 3 at positions corresponding to the downward nitrogen injectors 9 are configured by the stages 3B that inject nitrogen gas upward, and the outer stages 3 are configured by the stages 3A that inject air upward. That is, the stage 3A and the stage 3B are collectively referred to as the stage 3.

The nitrogen injector 6 in the laser emitter 5 injects the nitrogen supplied from the nitrogen introducer 21 in the exterior, and as a flow with no disturbance due to the internal structure of the nitrogen injector 6, the nitrogen is injected from the nitrogen injector 6 to the upper surface of the glass substrate 100. The downward nitrogen injector 9 injects the nitrogen supplied from the nitrogen introducer 21 in the exterior, to the downward and obliquely outer sides with respect to the working area W, so that the nitrogen is injected to the upper surface of the glass substrate 100. The nitrogen injected from the nitrogen injector 6 and the downward nitrogen injector 9 flows to the outside of the glass substrate 100, along the gap between the upper surface of the glass substrate 100 and the downward nitrogen injector 6.

The detail of the nitrogen injection by the downward nitrogen injector 9 will be described.

As shown in FIG. 4, when the glass substrate 100 comes in the working area W from the left side in the figure, the downward nitrogen injector 9 injects the nitrogen to the side opposite to the advancement direction D of the glass substrate 100. Therefore, the nitrogen is sufficiently supplied to the glass substrate 100 early. After the glass substrate 100 comes in the working area W, the downward nitrogen injector 9 on the right side in the figure, in the working area W, injects the nitrogen in the same direction as the advancement direction of the glass substrate.

The nitrogen injected from the nitrogen injector 6 and the downward nitrogen injector 9 flows to the outside of the glass substrate 100, along the gap between the upper surface of the glass substrate and the nitrogen injector 3.

Further, the lower surface of the glass substrate 100 is supported by the nitrogen injected from the stage 3B, in a floating and contactless manner. The lower surface of the glass substrate 100 is filled with the nitrogen, similarly to the upper surface.

As described above, the nitrogen injected from the nitrogen injector 6 and the downward nitrogen injector 9 is positioned so as to accord with at least the whole or part of the injection nitrogen from the stage 3B, and the vicinity of the laser emitter 5 is filled with the nitrogen. Therefore, it is possible to form and maintain a local nitrogen atmosphere, that is, the small-range atmosphere B.

That is, the stage 3B, the nitrogen injector 6 and the downward nitrogen injector 9 constitute the small-range atmosphere formation device in the invention.

Even when the glass substrate 100 is not below the laser emitter 5, the nitrogen atmosphere is formed by the nitrogen injection from the upper and lower surfaces. In the embodiment, the nitrogen is injected just downward by the downward nitrogen injector 9, and the small-range atmosphere is secured regardless of the existence of the glass substrate 100. Since the downward nitrogen injectors 9 inject the nitrogen in the oblique directions, the glass substrate 100 comes in contact with the nitrogen early. The small-range atmosphere B is formed so as to cover the upper side, the lower side and both lateral sides of the glass substrate 100, and the working area W is positioned in the small-range atmosphere B.

The small-range atmosphere does not need to be constantly formed during the conveyance of the glass substrate, and only needs to be formed at least by the time when the glass substrate 100, in the movement direction D, arrives at the region where the small-range atmosphere B is formed, or the time when the glass substrate 100 arrives at the working region.

Further, in the large-range region, the large-range atmosphere A composed of air is formed, and in the large-range atmosphere A, it is allowable to use the cleaned air introduced from the exterior of the large-range region, or use the air in the atmospheric air.

Furthermore, in the large-range region where the large-range atmosphere A is formed, the atmosphere is formed by adding the injection air injected upward from the stage 3A.

In the embodiment, the glass substrate is floated by the compressed air, and the nitrogen as the inert gas is injected at the vicinity of the laser emitter. However, the combination of the fluids is not limited to this, and all fluids that can be used for the laser emission are applicable.

Further, in the embodiment, the same mechanism is configured also in the forward and backward directions in FIG. 4. Thereby, when the glass substrate 100 arrives at the small-range atmosphere B, the glass substrate 100 is covered with the atmosphere gas from the upper side, the lower side and both lateral sides of the glass substrate 100. Further, it is preferable that at least the gas injection range of the nitrogen injector 6 and the upper-surface wall portion 7 be positioned to the outside of the working area W in the direction perpendicular to the conveyance direction, and it is preferable that the gas injection range of the stage 3B be positioned to the outside of the working area W similarly.

Here, in the embodiments, apparatuses in which the glass substrate, as the workpiece, is conveyed in a floating manner and the laser processing is performed have been described as objects. However, the workpiece is not limited to the glass substrate, and the processing for the working is not limited to the laser processing. Furthermore, the invention is not limited depending on whether the working is performed.

Thus, the invention has been described based on the above embodiments. However, the invention is not limited to the descriptions of the above embodiments, and appropriate modifications can be made without departing from the scope of the invention.

REFERENCE SIGNS LIST 1 processing chamber
2 laser processing apparatus
2A laser processing apparatus
2B laser processing apparatus
3 stage
3A stage
3B stage
5 laser emitter
6 nitrogen injector
7 upper-surface wall portion
8 downward nitrogen injector
9 downward nitrogen injector
20 air introducer
21 nitrogen introducer
100 glass substrate
A large-range atmosphere
B small-range atmosphere
D advancement direction

The invention claimed is:

1. An apparatus comprising:
a laser emitter emitting a laser light;
a stage over which a workpiece is to be conveyed in a conveyance direction, the stage being configured to inject a first inert gas and float the workpiece to which the laser light is shone in a state in which the workpiece is conveyed over the stage;
a gas injector located over the stage and configured to inject a second inert gas to the workpiece in the state in which the workpiece is conveyed over the stage; and
a wall surface located over the stage and below the gas injector,
wherein the wall surface is connected to the gas injector, and
wherein a length of the wall surface in the conveyance direction is larger than a length of the gas injector in the conveyance direction.

2. The apparatus according to claim 1, wherein the second inert gas flows between the workpiece and the wall surface.

3. The apparatus according to claim 1, wherein a local atmosphere comprising the first inert gas and the second inert gas is formed between the workpiece and the wall surface.

4. The apparatus according to claim 1, wherein:
the wall surface has an opening; and
the laser light is shone to the workpiece through the opening.

5. The apparatus according to claim 1, wherein the workpiece is a glass substrate over which an amorphous semiconductor film is formed.

6. The apparatus according to claim 1, wherein:
the stage has a first region and a second region adjacent to the first region in a plan view;
the laser light is located in the first region in the plan view; and
the first inert gas in injected in the first region.

7. The apparatus according to claim 1, wherein the first inert gas and the second inert gas is a same gas.

8. The apparatus according to claim 1, wherein the first inert gas and the second inert gas is nitrogen.

9. The apparatus according to claim 1, wherein the stage has a porous body located just under the gas injector.

10. An apparatus comprising:
a laser emitter emitting a laser light;
a stage over which a workpiece is to be conveyed in a conveyance direction, the stage being configured to inject a first inert gas and float the workpiece to which the laser light is shone in a state in which the workpiece is conveyed over the stage;
a gas injector located over the stage and configured to inject a second inert gas to the workpiece in the state in which the workpiece is conveyed over the stage; and
a wall surface located over the stage and below the gas injector, the wall surface having an opening through which the laser light is shone to the workpiece,
wherein the wall surface is connected to the gas injector,
wherein a length of the wall surface in the conveyance direction is larger than a length of the gas injector in the conveyance direction, and
wherein a local atmosphere comprising the first inert gas and the second inert gas is formed between the workpiece and the wall surface.

11. The apparatus according to claim 10, wherein the workpiece is a glass substrate over which an amorphous semiconductor film is formed.

12. The apparatus according to claim 10, wherein:
the stage has a first region and a second region adjacent to the first region in a plan view;
the laser light is located in the first region in the plan view; and
the first inert gas in injected in the first region.

13. The apparatus according to claim 10, wherein the first inert gas and the second inert gas is a same gas.

14. The apparatus according to claim 10, wherein the first inert gas and the second inert gas is nitrogen.

15. The apparatus according to claim 10, wherein the stage has a porous body located just under the gas injector.

* * * * *